United States Patent [19]
Ogashiwa et al.

[11] Patent Number: 6,160,224
[45] Date of Patent: *Dec. 12, 2000

[54] SOLDER MATERIAL AND ELECTRONIC PART USING THE SAME

[75] Inventors: Toshinori Ogashiwa; Takatoshi Arikawa, both of Tokyo, Japan

[73] Assignee: Tanaka Denki Kogyo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/075,951

[22] Filed: May 12, 1998

[30] Foreign Application Priority Data

May 23, 1997 [JP] Japan .................................. 9-133802
Sep. 29, 1997 [JP] Japan .................................. 9-264164

[51] Int. Cl.⁷ ........................................................ H05K 1/09
[52] U.S. Cl. ........................... 174/257; 148/400; 420/558; 420/566
[58] Field of Search ........................... 174/256, 257; 420/557, 558, 563, 566; 148/400, 405

[56] References Cited

U.S. PATENT DOCUMENTS 4,416,853  11/1983  Morikawa et al. .................... 420/469

FOREIGN PATENT DOCUMENTS

| 1127192 | 5/1989 | Japan . |
| 1237095 | 9/1989 | Japan . |
| 3204194 | 9/1991 | Japan . |
| 6269983 | 9/1994 | Japan . |
| 7-32188 | 2/1995 | Japan . |
| 7299585 | 11/1995 | Japan . |

OTHER PUBLICATIONS

ASTM vol. 02.04; 1987, pp. x–xiv, 21–31, 192–198, 917–921.

The Encyclopedia of Chemistry, Supplement, George L. Clark–Editor–in–Chief, Reinhold Publishing Corporation, 1958, p. 310.

McGraw–Hill Dictionary of Scientific and Technical Terms, Second Edition, Daniel N. Lapedes, Editor–in–Chief, 1978, p. 208.

Constitution of Binary Alloys, Second Edition, Dr. Max Hansen, McGraw–Hill Book Company, 1958, pp. x–xiv, 18, 610, 634, 1107.

*Primary Examiner*—Hyung-Sub Sough
*Attorney, Agent, or Firm*—Greenblum & Bernstein P.L.C.

[57] ABSTRACT

An object of this invention is to provide a solder material capable of, when joining an electronic component to a substrate with the solder material, improving heat fatigue resistance thereof and reducing damage of Ni film interposed therebetween. A solution of this invention is to assemble an electronic part by soldering a semiconductor device with a substrate using solder balls made of a solder material containing from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance containing Sn and unavoidable impurity.

10 Claims, 3 Drawing Sheets

SOLDER MATERIAL AND ELECTRONIC PART USING THE SAME

BACKGROUND OF THE INVENTION

1. Field of the Invention

This invention relates to solder material having an excellent heat fatigue resistance in a solder joining portion when an electronic component is joined to a substrate using the solder material, and an electronic part using the same.

2. Description of the Prior Art

Currently solder material is used for joining the IC chip, capacitor or the like to a substrate and eutectic solders essentially consisting of 5% by weight of Sn and 95% by weight of Pb or 63% by weight of Sn and 37% by weight of Pb are used.

On the other hand, when the IC chip, capacitor or the like is joined to the substrate using the solder material, usually film of Ni, Cu or the like is interposed therebetween.

The substrate having the IC chip or the like, incorporated in electronic apparatus is exposed to temperature cycle environment in which heating and cooling are repeated with ON/OFF of the electronic apparatus. Particularly with current trend of decreased size and thickness of its packages, there is produced such a problem that when the solder joined portion is exposed to temperature cycle environment, cracks are likely to occur. The reason is that although a measure against cracks was taken by design change of the mounting style according to the prior art, with the decreased size and thickness of the package, the freedom of mounting style design is limited so that the aforementioned measure is impossible to do.

Therefore, solder material not causing crack even if exposed to temperature cycle environment has been demanded.

To meet such a demand, for example, Japanese Unexamined Patent Application No. Hei 1-127192 has disclosed that by mixing a predetermined amount of tellurium with Sn—Pb alloy, anti-crack characteristic is improved. Further, Japanese Unexamined Patent Application No. Hei 1-237095 has disclosed that by mixing a predetermined amount of Sb and In with the Sn—Pb alloy, the anti-crack characteristic is improved. Japanese Unexamined Patent Application No. Hei 7-299585 has disclosed that by mixing a predetermined amount of Sb and Ni with the Sn—Pb alloy, the fatigue resistance is improved.

However, when the IC chip or the like is joined to the substrate by the aforementioned conventional solder material, the heat fatigue resistance of the solder material exposed to temperature cycle environment is demanded to be further improved.

Further, if the Ni film is interposed to improve the joining performance of the solder material, a solder material capable of reducing damage of such Ni film is demanded.

SUMMARY OF THE INVENTION

The present invention has been proposed to solve the above problems and it is therefore an object of the invention to provide a solder material wherein, when an electronic component such as the IC chip is joined to a substrate using the solder material, the heat fatigue resistance thereof is improved and damage of Ni film, if used, can be reduced, and an electronic part using the same solder material.

To achieve the above object, according to an aspect of the present invention, there is provided a solder material consisting essentially of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance containing Sn and unavoidable impurity.

That the content of Ag, In, that is, the content of at least one of Ag and In is from 0.1 to 8.0% by weight includes not only a case in which the content of at least one of Ag or In is from 0.1 to 8.0% by weight, but also a case in which both Ag and In are contained such that the total thereof is from 0.1 to 8.0% by weight.

Further, according to another aspect, the present invention provides a solder material consisting essentially of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance containing Sn and unavoidable impurity.

Still further the present invention provides an electronic part wherein an electronic component is joined to a substrate using the solder material mentioned according to one aspect of the invention, above.

Still further the present invention provides an electronic part wherein an electronic component is joined to a substrate using the solder material mentioned according to another aspect of the invention, above.

DESCRIPTION OF THE PREFERRED EMBODIMENTS

Figure 1:
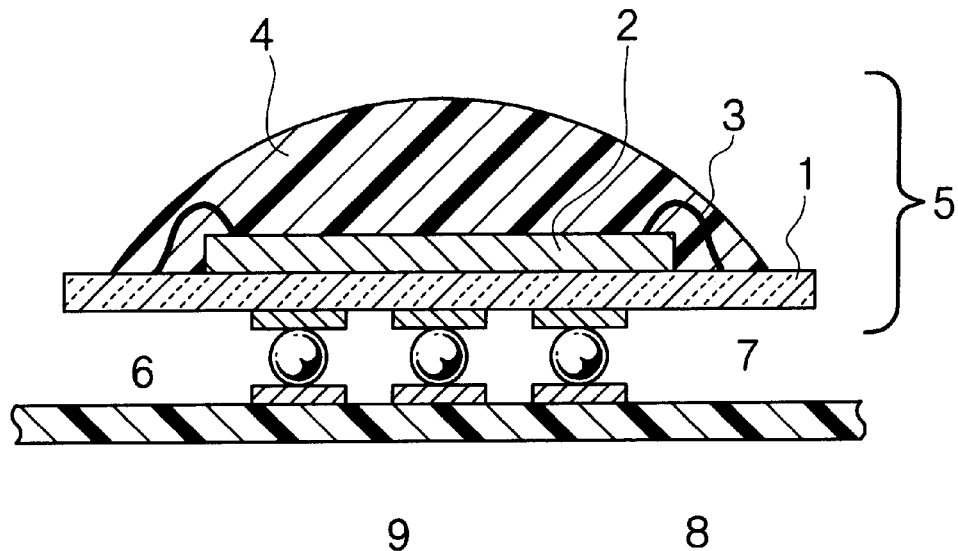
FIG. 1 is a longitudinal front sectional view showing an example of an electronic part using a solder material according to the present invention.

The embodiments of the present invention will be described with reference to the accompanying drawings.

As described previously, the present invention concerns solder material having a composition in which the content percentages of Fe, Ni, Ag, In, Pb, Sn are as described above and an electronic part obtained by joining an electronic component with a substrate using this solder material.

The electronic component mentioned in the present invention refers to a component soldered to a substrate such as IC chip, capacitor, semiconductor device, hybrid IC and the like.

The electronic part mentioned in the present invention refers to (1) semiconductor device containing the IC chips, (2) hybrid IC, and (3) device in which the IC chip, semiconductor device, capacitor or the like is mounted on a substrate.

Further, in the present invention, a copper stretched laminated plate for printing circuit and die for die bond, on which electronic components are mounted are referred to as the substrate. The copper stretched laminated plate for printing circuit includes resin binder substrate, ceramics substrate and the like. The resin binder substrate means a kind of the copper stretched laminated plate for printing circuit, in which resin is used mainly as binder material for the substrate material. The paper phenol copper stretched laminated plate, paper epoxy copper stretched laminated plate, glass epoxy copper stretched laminated plate and the laminated are included in this kind.

The solder material of the present invention employs Sn or Sn—Pb alloy as its base metal.

The Pb content of this solder material needs to be 0–70% by weight.

If the Pb content exceeds 70% by weight, liquidus temperature rises and it is not favorable for environmental problem.

To improve heat fatigue resistance of the solder material, the Pb content thereof is preferred to be 0–65% by weight.

As the Pb content is nearer the 0% by weight, the solder material is more gentle for the environment so that its heat fatigue resistance is improved. Thus it is favorable that the Pb content is 0% by weight.

When it is said that the Pb content is 0% by weight in the present invention, a fine amount of Pb mixing as unavoidable impurity is permitted.

In the present invention, it is necessary that in the aforementioned base metal, a predetermined amount of Fe or Ni is contained with at least one of Ag or In of a predetermined amount.

If the contents of Fe and Ni are less than 4.99% by weight, as compared to a type in which they are over 4.99% by weight, the heat fatigue resistance of the solder material is improved and if the Ni film is interposed between the substrate and solder material, damage of the Ni film can be reduced.

If the contents of Fe and Ni are more than 0.01% by weight, as compared to a type in which they are less than 0.01% by weight, the heat fatigue resistance of the solder material is improved and if the Ni film is interposed between the substrate and solder material, damage of the Ni film can be reduced.

If the total content of Fe and Ni is less than 5.0% by weight, as compared to a type in which it is over 5.0% by weight, the heat fatigue resistance of the solder material is improved and if the Ni film is interposed, damage of the Ni film can be reduced.

If the total content of Fe and Ni is more than 0.02% by weight, as compared to a type in which it is less than 0.02% by weight, the heat fatigue resistance of the solder material is improved and if the Ni film is interposed, damage of the Ni film can be reduced.

Therefore, it has been determined that Fe content is 0.01–4.99% by weight, Ni content is 0.01–4.99% by weight and the total content thereof is 0.02–5.0% by weight.

Under the present invention, it is necessary that in the aforementioned base metal, a predetermined amount of at least one of Ag and In is contained with Fe, Ni of the aforementioned predetermined amount.

If at least one of Ag and In is less than 8.0% by weight, as compared to a type in which it is more than 8.0% by weight, the heat fatigue resistance of the solder material is improved and if Ni film is interposed between the substrate and solder material, damage of the Ni film can be reduced.

If at least one of Ag and In is more than 0.1% by weight, as compared to a type in which any one of Ag or In is contained and its content is less than 0.1% by weight or both Ag and In are contained and the total content is less than 0.1% by weight, the heat fatigue resistance of the solder material is improved and if the aforementioned Ni film is interposed, the damage of that film can be reduced.

Therefore, the content of at least one of Ag and In is determined to be 0.1–8.0% by weight.

To improve the heat fatigue resistance of the solder material and reduce the damage of the Ni film, it is preferable that both Ag and In are contained and the Ag content is 0.05–6.0% by weight and In content is 0.05–2.0% by weight.

The solder material of the present invention can be processed in the form of tape, wire, pellet, cream or the like and used as material for immersion bath or vaporization. Further, it can be used as composite material in which high-melting point particles are mixed.

The processing method for the tape and wire are as follows.

In the case of tape, after casting in the form of an ingot, it is rolled and slit to a tape of a predetermined dimension. The tape dimension is selected in a range of 0.05–0.5 mm in thickness and 0.5–5.0 mm in width.

In the case of wire, after element wire is obtained by extrusion of ingot or injecting molten metal into water by quenching method, that element wire is extended to wire of a predetermined dimension. The wire dimension is selected in a range of 0.05–5.0 mm in diameter.

If it is intended to obtain cream solder, flux is used as viscous base and this is mixed and agitated with powdered solder so as to have an appropriate viscosity and then cream-like solder is produced. As the flux, rosin or polymerized rosin is dissolved with organic solvent and then activator is added so as to produce liquid flux. In addition, it is permissible to use other various kinds of flux such as inorganic acid series and organic acid series.

As for production of powdered solder, as a method for powdering from melting condition, granulating method, impact method and spray method are available.

As an example thereof, natural rosin (resin) is dissolved in aromatic high-quality alcohol so as to obtain liquid-state flux, and then that liquid-state flux is mixed and agitated with solder powder having 100–400 mesh, which is produced by spray method from an ingot adjusted and melted with a predetermined composition, in the ratio of 5–30 wt %, so as to obtain cream solder in viscosity range of 2–800,000 cps.

If the solder material of the present invention is used for joining the semiconductor device with a substrate, die bonding or hybrid IC, the solder material of the present invention can be used as a composite material in which high-melting point particle is mixed with the solder material having the aforementioned composition so as to maintain horizontality between the electronic component and substrate.

It is preferable that the melting point of the high-melting point particle is more than 400° C., the content thereof is 0.001–0.6% by weight and the diameter of the particle is 5–100 $\mu$m.

As the high-melting point particle, metallic powder of Cu, Ni or the like, oxide such as $SiO_2$ and carbide such as SiC can be mentioned as an example.

In the solder material of the present invention, if the Ni film or Cu film is coated on the surface of material to be joined by soldering also, joining performance by soldering can be improved.

Particularly, the solder material of the present invention is preferred for soldering with the Ni film coated on the resin binder substrate such as FR-4 specified under the NEMA.

Formation of the Ni film is carried out by plating, vaporization or the like. The thickness of the Ni film by vaporization is preferred to be 1000–3000 Å.

As electronic part of the present invention, for example, semiconductor device or BGA in which IC chip is die-bonded, particularly, CSP package in which a chip carrier substrate and main board substrate are joined by soldering through the Ni film can be mentioned.

The electronic part as a BAG package will be described with reference to FIG. 1.

Referring to FIG. 1, reference numeral 1 denotes an alumina substrate, numeral 2 denotes an IC chip, numeral 3 denotes bonding wire, numeral 4 denotes sealing resin, numeral 5 denotes a semiconductor device, numeral 6 denotes a semiconductor device pad electrode, and numeral 7 denotes solder ball made of the solder material of the present invention, which is joined to the pad electrode 6. Numeral 8 denotes glass epoxy copper stretched laminated plate as the main board. Numeral 9 denotes the pad electrode. The surface of the pad electrodes 6, 9 is coated with Ni plating or Cu plating. Further, flux for joining the solder ball 7 or cream solder is coated on the plating layer of the pad electrode 9. An electronic part having such a composition is passed through a heating oven in hydrogen atmosphere so as to melt the solder ball 7 and then the soldering is achieved.

Figure 2:
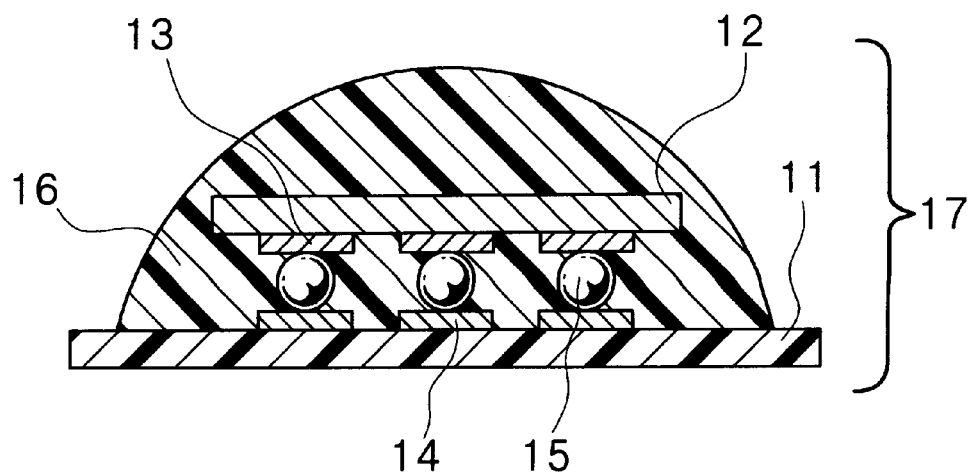
FIG. 2 is a perspective view showing an example of an electronic part using a solder material according to the present invention.

FIG. 2 shows electronic part in which a semiconductor device is mounted on a substrate.

In the same Figure, reference numeral 11 denotes an alumina substrate, numeral 12 denotes a IC chip, numerals 13, 14 denote a pad electrode and numeral 15 denotes solder ball made of the solder material of the present invention, which is joined to the pad electrode 13. The surface of the pad electrodes 13, 14 is coated with Ni plating or Cu plating and further, the plating layer of the pad electrode 14 is coated with flux for joining the solder ball 15 or cream solder. The electronic part having such a structure is passed through a heating oven so as to melt the solder ball 15 and the IC chip 12 is soldered on the alumina substrate 11. Finally the IC chip 12 is sealed by the sealing resin 16 so that the semiconductor apparatus 17 is completed.

Figure 3:
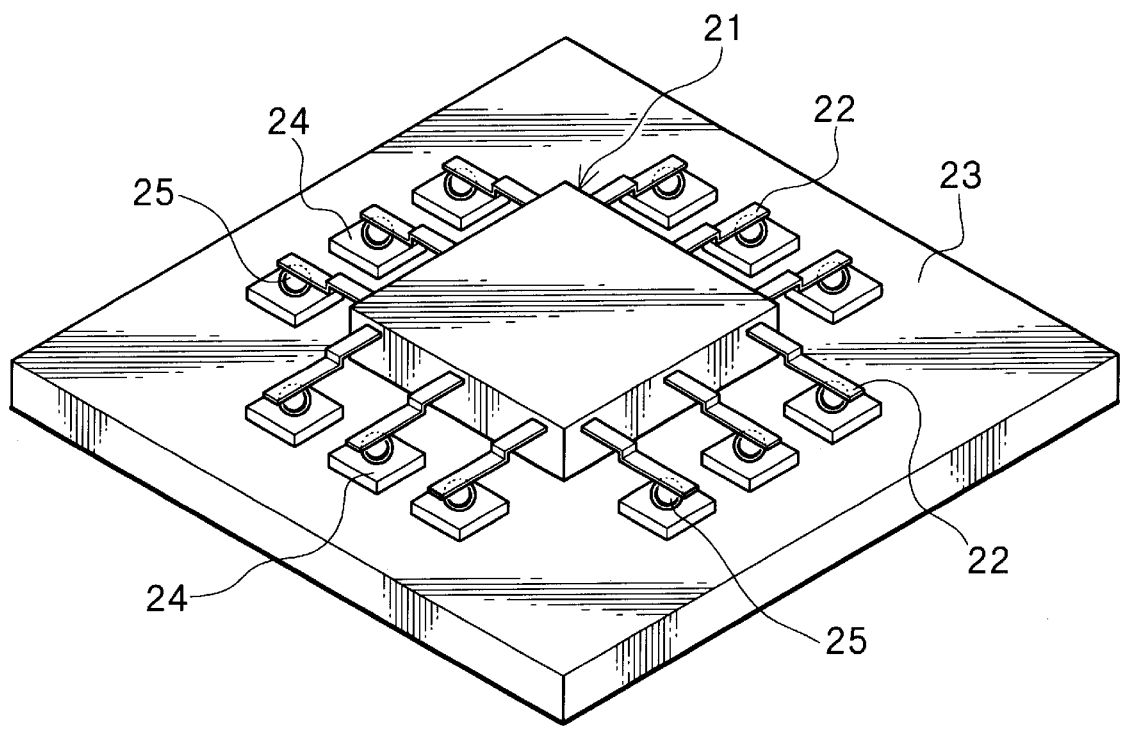
FIG. 3 is a longitudinal front sectional view showing an example of an electronic part using a solder material according to the present invention.

FIG. 3 shows an electronic part in which a substrate is loaded with a package-type semiconductor apparatus in which a semiconductor device is mounted on a lead frame and sealed with resin mold.

In the same Figure, reference numeral 21 denotes the aforementioned semiconductor apparatus, numeral 22 denotes an outer lead, numeral 23 denotes a substrate, numeral 24 denotes a pad electrode on the substrate and numeral 25 denotes the solder ball made of the solder material of the present invention, which is joined to the lead 22. The surface of the pad electrode 24 is coated with Ni plating or Cu plating. The plating layer of the pad electrode 24 is coated with flux for joining the solder ball 25 or cream solder. The electronic part having such a composition is passed through the heating oven so as to melt the solder ball 25 and the soldering is achieved.

Figure 4:
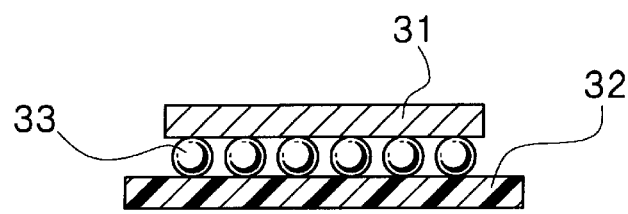
FIG. 4 is a longitudinal front sectional view showing an example of an electronic part using a solder material according to the present invention.

FIG. 4 shows an electronic part in which a semiconductor device is mounted on a substrate by die bonding. In the same Figure, reference numeral 31 denotes an IC chip, numeral 32 denotes a substrate, and numeral 33 denotes solder ball made of solder material of the present invention, which is joined to the IC chip 31. In the IC chip 31 and substrate 32, the surface of the solder ball bonding portion is coated with Ni plating or Cu plating. Further, the plating layer of the substrate 32 is coated with flux for joining the solder ball 33 or cream solder. The electronic part having such a composition is passed through the heating oven so as to melt the solder ball 33 and the soldering is achieved.

The aforementioned solder balls 7, 15, 25, 33 are formed from tape, wire, pellet or the like produced from the solder material of the present invention. If the cream solder is used instead of the solder ball, by printing and melting each predetermined amount of solder by screen printing method, the same effect as when the aforementioned solder ball is used can be obtained.

Although an example of the electronic part in which the IC chip or semiconductor is mounted on a substrate is described above, the solder material of the present invention can be used in producing an electronic part in which the hybrid IC or capacitor is joined to the substrate.

Further, the solder material of the present invention is preferably used in joining an electronic member having the Ni film.

[Embodiment A]

(Embodiment 1)

Predetermined amounts of Fe, Ni, Ag, In, Pb were mixed with Sn having purity of 99.99% by weight, melted in the vacuum and cast so as to obtain an ingot having a composition shown in Table 1. The ingot was rolled so that a tape of 0.1 mm in thickness×10 mm in width was obtained. That tape as row material was pressed so as to obtain solder pellet. The pellet was heated in oil and then cooled so that a solder ball having a diameter of 0.76 mm was finished.

Figure 5:
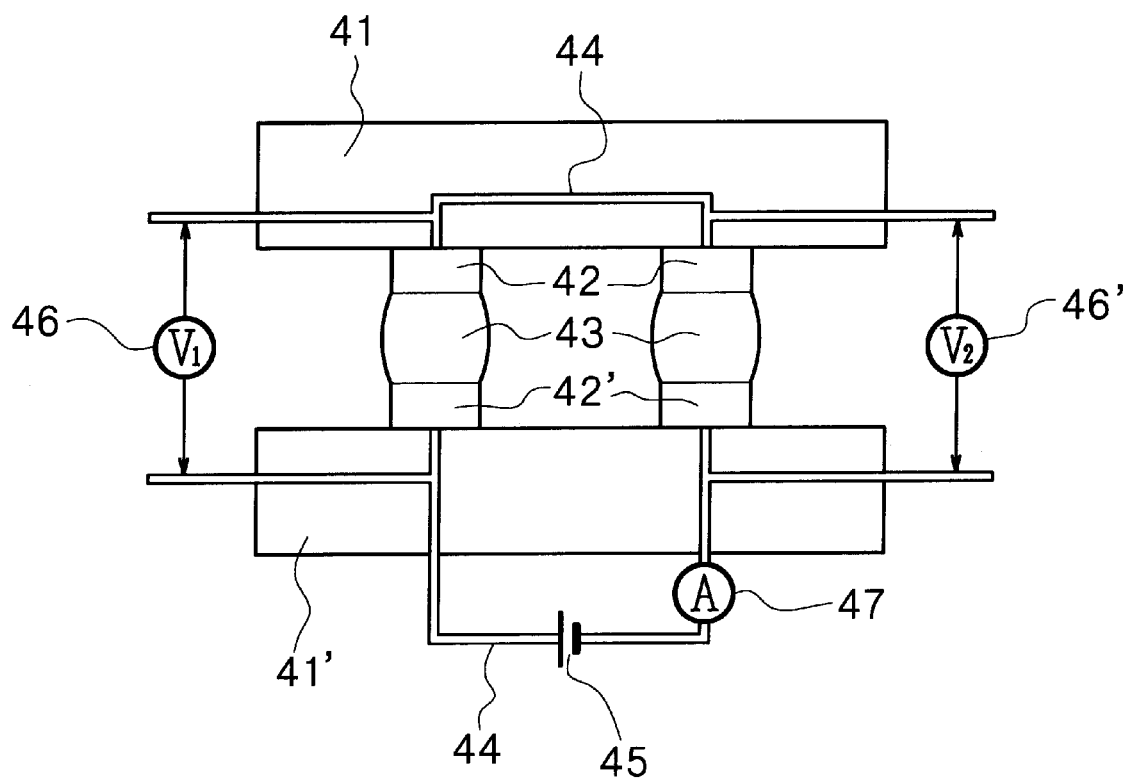
FIG. 5 is a schematic diagram of measurement method for the heat fatigue resistance of the solder material and Ni film damage degree according to the present invention.

The solder ball was supplied to the test apparatus shown in FIG. 5 and then its heat fatigue resistance and film damage degree were measured. The measurement method will be described.

As shown in the Figure, Ni films 42, 42' having a thickness of 3,000 Å formed by vaporization are formed on alumina substrate 41 and glass epoxy copper stretched laminated plate 41' with a distance therebetween of 2 mm. The aforementioned solder balls (0.76 mm Ø) 43 coated with flux (made by Nippon Alfametal, R5003) were placed at two places and the Ni films 42, 42' were connected with lead 44.

Next, the test piece was heated in the heating oven in hydrogen atmosphere and then taken out of the oven so as to cool. As a result, the substrates 41, 41' were joined by soldering at two places through the Ni films 42, 42'.

[Heat fatigue resistance measurement method]

A test of holding the aforementioned test piece in a cycle of −45° C. for 15 minutes and 120° C. for 15 minutes was carried out. A power supply 45, voltmeters 46, 46' and ammeter 47 were connected as shown in FIG. 5 so as to feed a constant current of 1 mA. Then, cycle number up to when the voltage rises rapidly due to an occurrence of crack was counted. The measurement result is shown in Table 2.

[Ni film damage degree measurement method]

A constant current of 1 mA was fed to the test piece shown in FIG. 5 and the voltages V1, V2 between the solder balls were measured and then a resistance was obtained by $R=(V1+V2)/I$.

Using the same test apparatus as shown in FIG. 5, deterioration performance was tested by soldering repeatedly 10 times according to the aforementioned soldering method. With resistance value R obtained when soldering was carried out once according to the aforementioned soldering method, as R1 and then resistance value when carried out ten times, as R10, (R10/R1) was regarded as the Ni film damage degree.

An average of five pieces on the test apparatus is shown in Table 2 as a measurement result of the Ni film damage degree.

(Embodiments 2–20/comparative examples 1–12)

The solder balls were obtained in the same manner as the embodiment 1 except the composition of the ingot described in the embodiment 1 was stated in Table 1, Table 3. A test apparatus was produced in the same way, and heat cycle test and Ni film damage test were carried out. The measurement results are shown in Table 2, Table 4.

TABLE 1

| | COMPOSITION % by weight | | | | | | |
|---|---|---|---|---|---|---|---|
| Embodiment | Fe | Ni | Fe + Ni | Ag | In | Pb | Sn |
| 1 | 0.01 | 0.01 | 0.02 | 3.00 | 1.00 | 54.00 | BALANCE |
| 2 | 1.00 | 1.00 | 2.00 | 3.00 | 1.00 | 54.00 | BALANCE |
| 3 | 2.00 | 2.00 | 4.00 | 3.00 | 1.00 | 54.00 | BALANCE |
| 4 | 0.01 | 4.99 | 5.00 | 3.00 | 1.00 | 54.00 | BALANCE |
| 5 | 4.99 | 0.01 | 5.00 | 3.00 | 1.00 | 54.00 | BALANCE |
| 6 | 2.00 | 2.00 | 4.00 | 0.05 | 0.05 | 54.00 | BALANCE |
| 7 | 2.00 | 2.00 | 4.00 | 6.00 | 2.00 | 54.00 | BALANCE |
| 8 | 2.00 | 2.00 | 4.00 | 3.00 | — | 54.00 | BALANCE |
| 9 | 2.00 | 2.00 | 4.00 | — | 1.00 | 54.00 | BALANCE |
| 10 | 2.00 | 2.00 | 4.00 | 3.00 | 1.00 | 65.00 | BALANCE |
| 11 | 2.00 | 2.00 | 4.00 | 3.00 | 1.00 | 70.00 | BALANCE |
| 12 | 0.01 | 0.01 | 0.02 | 3.00 | 1.00 | — | BALANCE |
| 13 | 1.00 | 1.00 | 2.00 | 3.00 | 1.00 | — | BALANCE |
| 14 | 2.00 | 2.00 | 4.00 | 3.00 | 1.00 | — | BALANCE |
| 15 | 0.01 | 4.99 | 5.00 | 3.00 | 1.00 | — | BALANCE |
| 16 | 4.99 | 0.01 | 5.00 | 3.00 | 1.00 | — | BALANCE |
| 17 | 2.00 | 2.00 | 4.00 | 0.05 | 0.05 | — | BALANCE |
| 18 | 2.00 | 2.00 | 4.00 | 6.00 | 2.00 | — | BALANCE |
| 19 | 2.00 | 2.00 | 4.00 | 3.00 | — | — | BALANCE |
| 20 | 2.00 | 2.00 | 4.00 | — | 1.00 | — | BALANCE |

TABLE 2

| Embodiment | Heat Cycle Test (cycle number) | Ni film damage degree (R10/R1) |
|---|---|---|
| 1 | 2500 | 1.5 |
| 2 | 2700 | 1.3 |
| 3 | 2800 | 1.4 |
| 4 | 2800 | 1.5 |
| 5 | 2800 | 1.5 |
| 6 | 2400 | 1.2 |
| 7 | 2900 | 1.3 |
| 8 | 2200 | 1.3 |
| 9 | 2200 | 1.1 |
| 10 | 2300 | 1.2 |
| 11 | 2100 | 1.3 |
| 12 | 2700 | 1.5 |
| 13 | 2900 | 1.4 |
| 14 | 3000 | 1.3 |
| 15 | 3000 | 1.5 |
| 16 | 3000 | 1.5 |
| 17 | 2600 | 1.2 |
| 18 | 3000 | 1.1 |
| 19 | 2400 | 1.3 |
| 20 | 2400 | 1.5 |

TABLE 3

| | COMPOSITION % by weight | | | | | | |
|---|---|---|---|---|---|---|---|
| Comparative Example | Fe | Ni | Fe + Ni | Ag | In | Pb | Sn |
| 1 | — | — | — | — | — | 54.00 | BALANCE |
| 2 | — | 2.00 | 2.00 | 3.00 | — | 54.00 | BALANCE |
| 3 | — | 2.00 | 2.00 | — | 1.00 | 54.00 | BALANCE |
| 4 | 7.00 | 2.00 | 9.00 | 3.00 | — | 54.00 | BALANCE |
| 5 | 2.00 | — | 2.00 | 3.00 | — | 54.00 | BALANCE |
| 6 | 2.00 | 7.00 | 9.00 | 3.00 | — | 54.00 | BALANCE |
| 7 | — | — | — | — | — | — | BALANCE |
| 8 | — | 2.00 | 2.00 | 3.00 | — | — | BALANCE |
| 9 | — | 2.00 | 2.00 | — | 1.00 | — | BALANCE |
| 10 | 7.00 | 2.00 | 9.00 | 3.00 | — | — | BALANCE |
| 11 | 2.00 | — | 2.00 | 3.00 | — | — | BALANCE |
| 12 | 2.00 | 7.00 | 9.00 | 3.00 | — | — | BALANCE |

TABLE 4

| Comparative Example | Heat Cycle Test (cycle number) | Ni film damage degree (R10/R1) |
|---|---|---|
| 1 | 1300 | 2.8 |
| 2 | 1500 | 2.2 |
| 3 | 1500 | 2.3 |
| 4 | 1600 | 2.4 |
| 5 | 1400 | 2.2 |
| 6 | 1600 | 2.4 |
| 7 | 1500 | 3.9 |
| 8 | 1700 | 1.7 |
| 9 | 1700 | 1.8 |
| 10 | 1800 | 3.5 |
| 11 | 1600 | 1.8 |
| 12 | 1800 | 3.4 |

As described above, using the solder material of the present invention, tests in soldering substrates with the Ni films interposed were carried out. According to the above measurement results, excellent effects were obtained such that the heat fatigue resistance of the solder material was improved and the damage of the Ni film could be damaged.

The heat fatigue resistance mentioned in this test means a count of cycle number up to when the voltage rises rapidly by feeding of a constant current as described previously. When the voltage rose rapidly, crack was found in the solder material. Thus, the cycle number up to when the voltage rises rapidly mentioned in this test, can refer to a cycle number up to when the crack occurs in the solder material when exposed to heat cycle environment.

Although ordinarily the solder bonding surface is coated with the Ni film to improve the bonding performance of the solder material, that bonding performance sometimes drop with a passage of time. The reason was found to be that the Ni film was dissolved and damage so that non-bonding surface is produced. Paying attention to the fact that electric resistance was increased by formation of the Ni non-bonding surface, the aforementioned (R10/R1) which was the soldering deterioration degree was used as an evaluation criterion for the Ni film damage degree in this test.

In the embodiments 1–20 in which Fe was 0.01–4.99% by weight, Ni was 0.01–4.99% by weight, total amount thereof was 0.02–5.0% by weight, at least one of Ag and In is 0.1–8.0% by weight, Pb was 0–70% by weight and the balance contained Sn and unavoidable impurity, it was found that the cycle number in heat cycle test was 2,100–3,000 and the Ni film damage degree was 1.1–1.5.

In the embodiments 1–10, 12–20 in which the Pb content was 0–65.0% by weight, an excellent effect was produced, indicating that the cycle number in the heat cycle test was 2,300–3,000. Therefore, the Pb content is preferred to be 0–65.0% by weight.

In the embodiments 12–20 in which the Pb content was 0, a further excellent effect was produced, indicating that the cycle number in the heat cycle test was 2,400–3,000. Considering that the solder material is gentle for the environment, the Pb content is further preferred to be 0.

If the embodiments 3, 6, 7, 8, 9 in which the contents of Fe, Ni, Pb are equal are compared, it is found that the embodiments 3, 6, 7 are excellent in cycle number in the heat cycle test. Further, if the embodiments 14, 17, 18, 19, 20 are compared, it is found that the embodiments 14, 17, 18 are excellent in cycle number in the heat cycle test.

Therefore, it is favorable that both Ag and In are contained, the contents thereof are Ag; 0.05–6.0% by weight and In: 0.05–2.0% by weight.

In the comparative examples 2, 3, 5, 8, 9, 11 which contains any one of Fe or Ni in a predetermined amount, the cycle number in the heat cycle test was 1,400–1,700 and the Ni film damage degree was 1.7–2.2.

Therefore, it is found that a more excellent effect is produced if both Fe and Ni are contained in each predetermined amount corresponding to the object of the present invention.

In the comparative examples 1, 7 in which the contents of Fe and Ni were less than the predetermined amount and in the comparative example 4, 6, 10, 12 in which they were over the predetermined amount, the cycle number in the heat cycle test was 1,300–1,800 and the Ni film damage degree was 2.4–3.9.

Therefore, it is found that a more excellent effect is produced if both Fe and Ni are contained corresponding to the object of the present invention.

[Embodiment B]

Predetermined amounts of Fe, Ni, Ag, In, Pb were mixed with Sn having purity of 99.99% by weight, melted in the vacuum and cast so as to obtain an ingot having the same composition as the embodiment 1 shown in Table 1. This ingot was melted and then solder powder of 100–300 mesh was produced by spray method. Liquid flux in which natural rosin was dissolved in high-quality alcohol was mixed and agitated with the solder powder so as to obtain cream solder having a desired viscosity. Then the cream solder was supplied to the test apparatus shown in FIG. 5. In this case, the cream solder was supplied to the bonding surface (bottom surface of the Ni film in FIG. 5) the Ni film 42 by screen printing method and heated and melted, so that the solder ball 43 was formed. Flux (flux contained in the cream solder) in the solder ball 43 is removed by washing. Then, bonding flux is coated on the bonding surface (top surface of the Ni film 42' in FIG. 5) of the Ni film 42' and the substrate 41 was set on the substrate 41' so that the solder ball 43 was placed on the Ni film 42'. After that, the Ni films 42, 42' were connected with the lead 44.

Next, the test piece was heated in the heating oven in hydrogen atmosphere and then taken out of the oven so as to cool. As a result, the substrates 41, 41' were joined by soldering at two places through the Ni films 42, 42'. As for the test pieces, the heat fatigue resistance and Ni film damage degree thereof were measured in the same manner as the embodiment A. As a result, the same measurement effect as the embodiment 1 shown in Table 2 was obtained.

Further, test pieces were produced in the same way as described above except that the composition of the ingot was the same as in the embodiments 2, 5, 6, 13, 14 shown in Table 1, and the heat fatigue resistance and Ni film damage degree were measured in the same way. As a result, the same measurement effect as in the embodiments 2, 5, 6, 13, 14 shown in Table 2 was obtained.

Therefore, in the case when the solder ball was formed by cream solder, it was found that the same effect as the embodiment A could be obtained.

As described above, because the present invention achieves a solder material consisting essentially of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance containing Sn and unavoidable impurity, when an electronic part such as the IC chip or the like is joined to a substrate using the solder material, the heat fatigue resistance of the solder material is improved and further if the Ni film is interposed in that joining, damage of the Ni film can be reduced.

Further, because the present invention also achieves a solder material consisting essentially of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance containing Sn and unavoidable impurity, it is possible to provide a solder material very effective for production and assembly of small-size, thin type electronic parts in which correspondence to an occurrence of crack is impossible because the freedom of the mounting style is limited by such small size.

The solder material of the present invention can be used in the form of tape, wire, pellet, cream or the like, and as material for immersion bath or vaporization, and as a composite material in which high-melting point particle is mixed, so that it can correspond to various demands depending on its application and use condition.

Further, because the electronic part of the present invention is so constructed that an electronic component is joined to a substrate using the aforementioned solder material, the heat fatigue resistance of the solder joining portion is improved and if the Ni film is interposed, damage degree of the Ni film is reduced. As a result, even if exposed to temperature cycle environment (environment for use) in which heating and cooling are repeated, the product provided by the present invention is capable of maintaining appropriate operation for a long term, thereby ensuring a high reliability.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A solder material consisting essentially of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance being Sn and unavoidable impurity.

2. A solder material consisting essentially of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance being Sn and unavoidable impurity.

3. An electronic part wherein an electronic component is joined to a substrate using a solder material consisting essentially of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance being Sn and unavoidable impurity.

4. An electronic part wherein an electronic component is joined to a substrate using a solder material consisting essentially of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance being Sn and unavoidable impurity.

5. An electronic part according to claim 4 wherein the substrate is a resin binder substrate.

6. A solder material consisting of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance being Sn and unavoidable impurity.

7. A solder material consisting of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance being Sn and unavoidable impurity.

8. An electronic part wherein an electronic component is joined to a substrate using a solder material consisting of from 0.01 to 4.99% by weight of Fe; from 0.01 to 4.99% by weight of Ni, total thereof being from 0.02 to 5.0% by weight; from 0.1 to 8.0% by weight of at least one of Ag and In; from 0 to 70% by weight of Pb, balance being Sn and unavoidable impurity.

9. An electronic part wherein an electronic component is joined to a substrate using a solder material consisting of from 0.01 to 4.99% by weight of Fe; from 0.01 to 4.99% by weight of Ni, total thereof being from 0.02 to 5.0% by weight; from 0.05 to 6.0% by weight of Ag; from 0.05 to 2.0% by weight of In; from 0 to 70% by weight of Pb, balance being Sn and unavoidable impurity.

10. An electronic part according to claim 9 wherein the substrate is a resin binder substrate.

* * * * *